(12) United States Patent
Lim

(10) Patent No.: US 7,487,064 B2
(45) Date of Patent: Feb. 3, 2009

(54) METHOD FOR DETECTING AND MONITORING DEFECTS

(75) Inventor: Sheldon C. P. Lim, Sunnyvale, CA (US)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 751 days.

(21) Appl. No.: 10/622,247

(22) Filed: Jul. 18, 2003

(65) Prior Publication Data

US 2005/0027476 A1 Feb. 3, 2005

(51) Int. Cl.
*G06F 19/00* (2006.01)
*G06F 15/00* (2006.01)

(52) U.S. Cl. ............... 702/179; 702/180; 702/182; 702/188; 324/716

(58) Field of Classification Search ............... 702/57, 702/58, 117, 179, 109–110, 180, 182, 188; 324/716, 718, 691, 699, 178; 438/14, 18; 700/109–110
See application file for complete search history.

(56) References Cited

U.S. PATENT DOCUMENTS

| | | | |
|---|---|---|---|
| 5,514,974 A | 5/1996 | Bouldin | |
| 5,552,718 A | 9/1996 | Bruce | |
| 5,574,890 A * | 11/1996 | Rackoff et al. | 703/1 |
| 5,627,101 A | 5/1997 | Lin et al. | |
| 5,787,190 A * | 7/1998 | Peng et al. | 382/145 |
| 5,883,437 A | 3/1999 | Maruyama et al. | |
| 5,987,398 A | 11/1999 | Halverson et al. | |
| 6,022,750 A * | 2/2000 | Akram et al. | 438/18 |
| 6,049,220 A * | 4/2000 | Borden et al. | 324/765 |
| 6,087,189 A | 7/2000 | Huang | |
| 6,217,651 B1 * | 4/2001 | Kashino et al. | 117/85 |
| 6,218,847 B1 * | 4/2001 | Matsushita | 324/716 |
| 6,393,714 B1 * | 5/2002 | Look et al. | 33/645 |
| 6,403,389 B1 | 6/2002 | Chang et al. | |
| 6,466,038 B1 | 10/2002 | Pekin | |
| 6,615,142 B1 * | 9/2003 | Hovde | 702/30 |
| 6,657,439 B1 * | 12/2003 | Harada | 324/600 |
| 6,665,577 B2 * | 12/2003 | Onyshkevych et al. | 700/130 |
| 7,091,733 B2 * | 8/2006 | Takekoshi et al. | 324/760 |
| 2003/0124761 A1 * | 7/2003 | Baert et al. | 438/50 |
| 2004/0071888 A1 * | 4/2004 | Chondroudis et al. | 427/402 |
| 2004/0233445 A1 * | 11/2004 | Littau et al. | 356/401 |
| 2005/0035433 A1 * | 2/2005 | Park et al. | 257/620 |

OTHER PUBLICATIONS

Plusquellic et al., "Identification of defective CMOS devices using Correlation and Regression Analysis . . . Data" website www.csee.umbc.edu.

* cited by examiner

*Primary Examiner*—Eliseo Ramos Feliciano
*Assistant Examiner*—Phuong Huynh
(74) *Attorney, Agent, or Firm*—Horizon IP Pte Ltd

(57) ABSTRACT

A method that uses a goodness of fit test/measurement (e.g., correction coefficient) for process control of a test parameter (e.g., resistance). At least the minimum number of test values required to calculate a goodness of fit test is obtained. A curve is fitted for the test parameters values and the independent variable(s). A goodness of fit measurement/test (e.g., correlation coefficient) is calculated for the curve and data. The goodness of fit measurement value is used for process control. Control limits can be established on the goodness of fit measurement values. The use of the goodness of fit test is a sensitive test that can used to control processes with low level defects or small fluctuations.

32 Claims, 4 Drawing Sheets

| TEST SITE (TS) CONFIGURATION | TEMPERATURE | RESISTANCE |
| --- | --- | --- |
| TS1 - W1 | T1 | R1 |
| TS1 - W1 | T2 | R2 |
| TS2 - W2 | T1 | R3 |
| TS2 - W2 | T2 | R4 |
| TS3 - W3 | T1 | R5 |
| TS3 - W3 | T2 | R6 |

TS is test site configuration with effective Width $W_i$
$T_i$ is Test Temperature
$R_i$ is measured resistance on Test site

FIGURE 5B

METHOD FOR DETECTING AND MONITORING DEFECTS

BACKGROUND OF INVENTION

1. Field of the Invention

This invention relates generally to methods to control processes and to screen product and more particularly to a statistical process control method for using regression analysis and goodness of fit measurements to control processes and/or to screen devices and more particularly to a statistical process control method for using goodness of fit measurements to control electronic/semiconductor manufacturing processes, such as resistance and void defects in conductive lines.

2. Description of the Prior Art

During the fabrication of semiconductor devices, multiple film layers are deposited on a substrate. Preferably, the film layer should form a continuous coating of uniform thickness over the entire surface of the substrate. For example, a metal film layer may be used to cover a dielectric layer, wherein the dielectric layer includes holes or trenches extending therethrough. The metal film fills or conformally covers the holes or trenches in the dielectric layer to provide a conductive path through the dielectric layer to the layer or layers beneath the dielectric layer. After the metal film is deposited on the dielectric layer, it may then be masked and etched to form isolated metal interconnects on the substrate that extend above the base of any hole or trench by a height that approximately equals the sum of the thickness of the metal film deposited on the dielectric layer and the depth of the hole or trench.

To ensure that the interconnects formed on the substrate have the desired electrical properties, the thickness of the metal film layer deposited on the substrate must be maintained within a specified tolerance band. If the metal film is too thick or too thin, the height, and thus the electrical resistance, of the interconnects created on the substrate will fall outside of the desired tolerance range. Likewise, if the thickness of the film layer is substantially non-uniform, the electrical resistance of a potion of the interconnects will fall outside of the desired tolerance range. In these cases, the devices ultimately formed with the interconnects that fall outside of the tolerance range will be defective.

One method of method of monitoring the thickness of an electrically conductive film deposited on a semiconductor substrate is to measure the electrical sheet resistance of the film.

The sheet resistance of thin films is commonly measured with one of two different measuring apparatuses. A multi-point probe may be placed into contact with the film layer to measure the resistance of the film layer between the points, or a non-contacting eddy current probe may be placed in proximity with the substrate to measure the sheet resistance of the film layer. Based upon the sheet resistance value obtained for the film layer, in comparison with the tolerance band for the sheet resistance value and the prior sheet resistance values obtained from the same batch of substrates, a determination can be made as to whether any adjustments in the operating parameters of the deposition chamber need to be made.

Examples of a resistance measurement and a sheet resistivity measurement are provided here. Resistance can be measured on a two point structure (not shown). FIG. 1 shows schematically a four-point Kelvin technique in the prior art for measuring the resistance value of a device 1000 (e.g., a resistor) in an integrated circuit. In FIG. 1, device 1000 is connected to four terminals (pads) 1001-1004. According to the four-point Kelvin technique, a current I is forced through device 1000 via terminals 1001 and 1002, resulting in a voltage difference $V_1-V_2$ across device 1000. The voltage difference is measured across the other two terminals 6003 and 6004. The resistance R of device 1000 is provided by:

$$R=(V_1-V_2)/I$$

Sheet resistance Rs is a convenient measure of resistivity of a conducting layer.

FIG. 2 shows a Kelvin structure 2000 In Kelvin structure 2000, rectangular portion 2201 for which a resistance is measured. Rectangular portion 11201 has a length L which is much greater than its width W. A current I is forced across the length of rectangular portion 2201 via probe pads 2202 and 2203 to create a voltage difference $\Delta V=V_1-V_2$ along the length of rectangular portion 2201, which is measured across probe pads 2204 and 2205. The sheet resistance (Rs) is thus determined by:

$$Rs=\Delta V/I*W/L$$

By choosing a width W which is much larger than the minimal width $W_{min}$ for conductors in the layer in question (e.g., $W=20*W_{min}$), Kelvin structure 1000 is relatively insensitive to CD loss. Further, by having a length L much greater than its width W, thereby raising its resistance R along length L, test structure 1000 maintains a relatively measurable voltage difference across probe pads 2204 and 2205, while avoiding excessive heating effects because of the relatively smaller current. Rectangular portion 2201 is provided only for illustrative purpose. In fact, the shape of the portion across which resistance is measured is not essential for achieving the results above. To provide the requisite measurable resistance, an effective length in the direction of current flow which is significantly greater than its effective width suffices. For example, region 2201 could be replaced with a serpentine resistive trace which has a total length greatly exceeding its width, provided that the resistive trace's width significantly exceeds the minimum width $W_{min}$ for the conductor layer. A field solver can be used to calculate the effective length-to-width ratio, and hence the relationship between R and Rs, using well-known techniques.

Resistance measurements are common methods to monitor and control the resistivity (sheet resistance) and width in semiconductor processing. However, the inventor has found resistance measurements are generally not sensitive enough to detect small, low level defects, such as void defects.

The semiconductor and electronics industry primarily depended on manual microscopic, and more recently, automated inspection techniques to find and screen defects. These techniques become less effective, however, as geometries continue to shrink into the deep submicron regime, since the size for which defects are critical also shrink. Defects such as interior voids in conductive lines are even more difficult to detect visually. Moreover, some defects, such as stress induced voids in Al lines, may not appear until several process steps after the Al conductors were inspected.

There is a need for an improved process control and device screening method to be sensitive to small variations in measured test values, such as sheet resistance.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 6,403,389B1 (Chang et al.) shows a method for measuring sheet resistance.

U.S. Pat. No. 5,627,101 (Lin et al.) shows a test method for electro-migration using a Metal and Poly test structure U.S. Pat. No. 5,987,398 (Halverson et al.) shows a method for SPC for a process having a non-constant mean of a response variable.

U.S. Pat. No. 5,883,437 (Maruyama et al.) discloses a method for applying a time varying voltage between the electrode and wiring pattern at different locations.

U.S. Pat. No. 6,466,038 (Pekin, et al.) shows a method for non-isothermal electro-migration testing of interconnects.

U.S. Pat. No. 5,514,974 (Bouldin) shows a method for testing for metal failures by using 2 different test structures.

U.S. Pat. No. 6,087,189 (Huang) shows test structure to monitor silicide.

U.S. Pat. No. 5,552,718 (Bruce et al.) shows a test structure for space and line measurement.

SUMMARY OF THE INVENTION

It is an object of an embodiment of the present invention to provide a process control or screening method.

It is an objective of an embodiment of the invention to provide a test method that is sensitive to low level defects.

An embodiment of the present invention provides a method of testing which is characterized as follows. First, test measurement values from a device are obtained at a plurality of independent variable values. We calculate a goodness of fit value for a fitted curve between: (1) the test measurement values; and (2) the independent variable values. We use the goodness of fit value to monitor the processes used to form the device.

Another aspect of the embodiment includes using control limits on the goodness of fit values.

Another aspect further includes using control limits on the goodness of fit values; the control limits established based on a history of goodness of fit values or on device requirements.

Another aspect further includes the goodness of fit is a correlation coefficient or a standard error value.

Another aspect further includes the fitted curve is a least squares fitted straight line.

Another embodiment of the present invention provides a method of testing which is characterized as follows.

a) providing a device structure that has at least a first test structure, a second test structure and a third test structure incorporating a resistive portion from which resistance is measured;
  (1) the resistive portion having an effective length (Lx) and an effective width (Wx),
  (2) the first, second and third test structures have resistive portions with different effective widths (W1 W2, . . . Wi);
  (3) the resistive portion of the first, second and third type test structures have effective lengths (L1, L2, . . . Li);
b) measuring the resistance (R) of the test structures;
c) calculating the goodness of fit value for a fitted curve between:
  (1) the effective length divided by the measured resistance (L1/R1, L2/R2, . . . Li/Ri); and
  (2) the effective widths (W1, W2, . . . Wi ) of the test structures;
d) using the goodness of fit value to: (1) control the processes used to form the device or (2) screen the devices.

An advantage of the embodiment of the invention is that the goodness of fit measurements values are sensitive to low level defects that may not show up in standard SPC methods. For example, the embodiments are can use resistance measurement to monitor for low level defects (e.g., voids defects) in metal lines where the void defects raise the resistance, but not enough to exceed traditional control limits.

Additional objects and advantages of embodiments the invention will be set forth in the description that follows, and in part will be obvious from the description, or may be learned by practice of the invention. The objects listed above are incomplete and do not limit the invention in any way. The objects and advantages of embodiments of the invention may be realized and obtained by means of instrumentalities and combinations particularly pointed out in the append claims.

BRIEF DESCRIPTION OF THE DRAWINGS

The features and advantages of a test method according to example embodiments the present invention and further details of a control method in accordance with embodiments of the present invention will be more clearly understood from the following description taken in conjunction with the accompanying drawings in which like reference numerals designate similar or corresponding elements, regions and portions and in which:

FIG. 5B shows a table with resistance data from 2 different test site (with different widths) and at two temperatures according to an example embodiment.

DETAILED DESCRIPTION OF THE PREFERRED EMBODIMENTS

Figure 1:
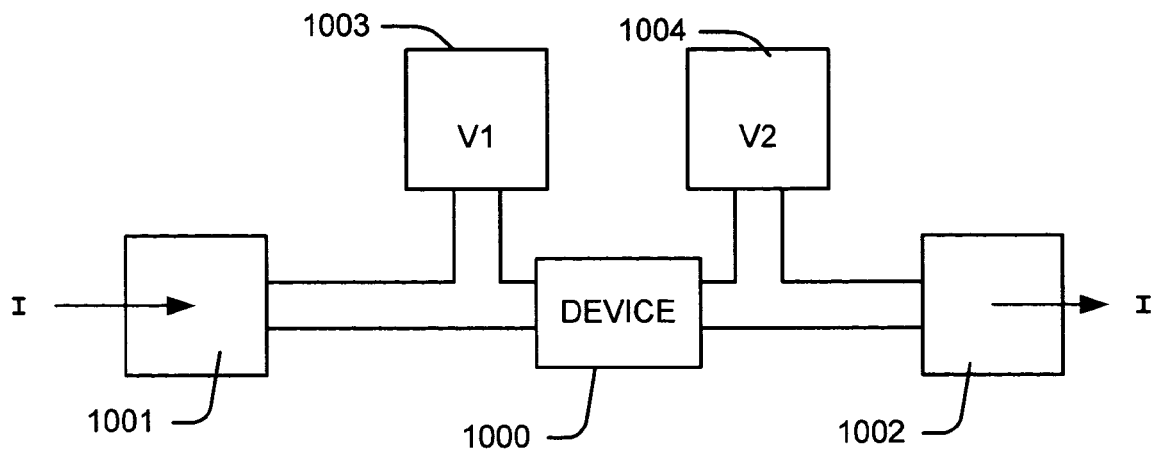
FIG. 1 shows a four-point Kelvin structure 600 of the prior art for measuring resistance of a device according to the prior art.

The inventor has found that conventional Statistical Process control methods are insensitive to low level defects. For example, resistance measurements are common methods to monitor and control the resistivity (sheet resistance) and width of conducting lines and resistors in semiconductor processing. The inventor has found that resistance measurements can be used to detect defects that increase resistance. The inventor has found that traditional SPC methods using measured resistance measurement values are not sensitive to monitor low level defects (e.g., metal voids). The resistance values are relatively insensitive and also ambiguous, as the fluctuations due to defects are compounded with the fluctuations due to resistance variations that may also arise from compositional variation or dimensional variation. The inventor has found using 3 sigma control limits on resistance measurements were not sensitive enough to detect small, low level defects in metal lines, such as void defects. Resistance excursions outside a 3 sigma control limit have been false signals for metal voiding. These false alarms created delays shipping wafers, as well as causing the unproductive deployment of resources to investigate whether metal voiding was present.

Overview

An example embodiment of the invention is a method that uses a goodness of fit value measure arising from a regression or curve fitting technique test/measurement (e.g., correction correlation coefficient, standard error) for a test parameter (e.g., resistance) for monitoring/screening or for process control. The goodness of fit value arises from a regression or curve fitting technique. The minimum number of test values required to calculate a goodness of fit test is obtained.

A curve is fitted to the test parameters values (e.g., dependent variable) and an independent variable (s). A goodness of fit measurement/test (e.g., correlation coefficient) is performed on the curve. The goodness of fit measurement value is used to screen devices (wafers) or for process control. Control limits or scrap limits can be established on the goodness of fit measurement value.

The embodiment's goodness of fit test is thought to be more sensitive than conventional SPC methods. One reason for the embodiment sensitivity is that the embodiment utilizes multiple measurements for curve fitting. In contrast, usual SPC methods use a single measurement. Moreover, the example embodiment for monitoring resistivity tests resistivity on multiple width lines, both larger and at least one that is equal to the minimum usable line width of the particular technology. For example, 0.18 um CMOS technology has a drawn 0.18 um polysilicon and width. If desired, one measurement can be made on a smaller than the usable linewidth to enhance the sensitivity to small defects but at the risk of introducing false signals because the process may not be fully capable of a smaller width.

A. Dependent Variables

The test value (e.g., measured value or result value) is the dependent variable. Other variables are independent variables. For example, the independent variables can be parameters of the test structure (e.g., resistor width) or test conditions (e.g., temperature).

The test values can be obtained using any combination of test structures and test conditions or any other independent variable(s). For example, the test values can be measured on three different test sites that have different test structures.

Also, the test parameters can be obtained on one test site, but the tests are performed under different conditions (e.g., temperature, current, voltage, light intensity, etc.). In addition, different combinations of dependent variables are possible, such as making measurements on two different test site configurations at two different conditions.

As the number of independent variables (N–degrees of freedom) increase, the minimum number to data point is required to obtain the goodness of fit values increases(N+2).

B. Goodness of Fit Tests

The embodiment can use many types of goodness of fit tests, such as correlation coefficients (r or r-sq), standard error of the regression, F test statistics, or other types of statistics that evaluate the difference between the predicted values of the regression to the actual measured values.

C. Curve Fitting

The curve fitting formula or model relates the dependent variable to the independent variable. The embodiments can use any type of curve fitting formula, such as for example, a straight line, curve, nth order polynomial, trigonometric, exponential, or logarithmic equation.

Example Embodiment of Using Goodness of Fit Values for Monitoring Resistance on Electronic Devices An example embodiment of the invention is a method using goodness of fit value (e.g., correlation coefficient) for resistance (test parameter–dependent variable) on a wafer (e.g., device structure) to screen for defects or for process control. The resistance is measured on at least 2 different test structures that have different widths. The correlation coefficient is calculated for the least squares straight line fit of Resistance (dependent value) vs Width (independent value).

Figure 2:
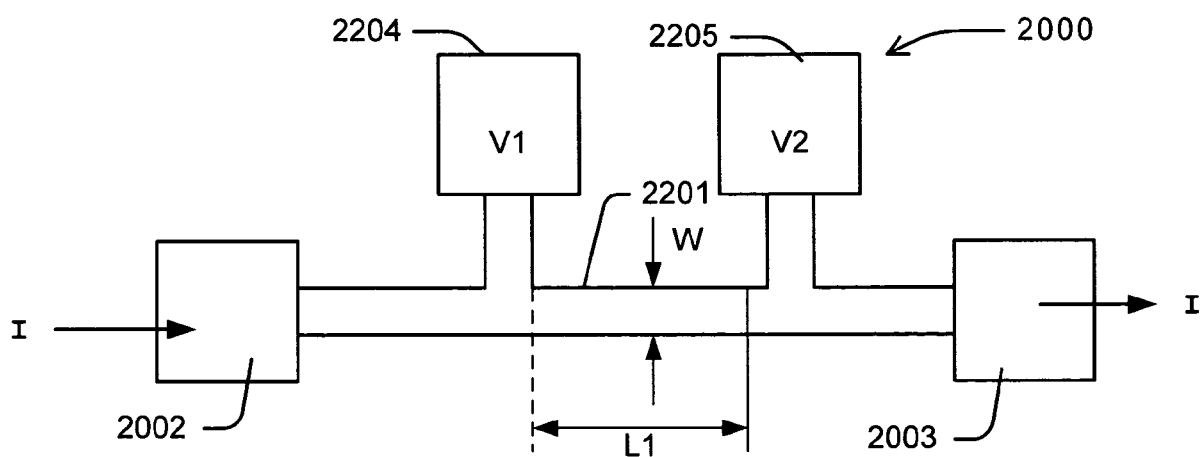
FIG. 2 shows a four-point Kelvin test structure 1000 for determining a sheet resistivity for a conductor layer; four-point Kelvin test structure is relatively insensitive to critical-dimension loss according to the prior art.

The test method comprises the following. A device structure, such as a wafer is provided. The wafer has at least a first test structure, a second test structure and a third test structure. The test structures preferably incorporate a resistive portion from which resistance is measured. For example, see resistance test structures in FIGS. 1 and 2.

The resistive portion has an effective length (Lx) and an effective width (Wx). The first, second and third test structures have resistive portions with different effective widths (W1 W2 ... Wi).

The resistive portion of the first, second and third type test structures have effective lengths (L1, L2, ... Li). The effective lengths can be the same for all test structures but do not have to be.

Next, the resistance (Ri) of each of the test structures is measured.

Figure 3:
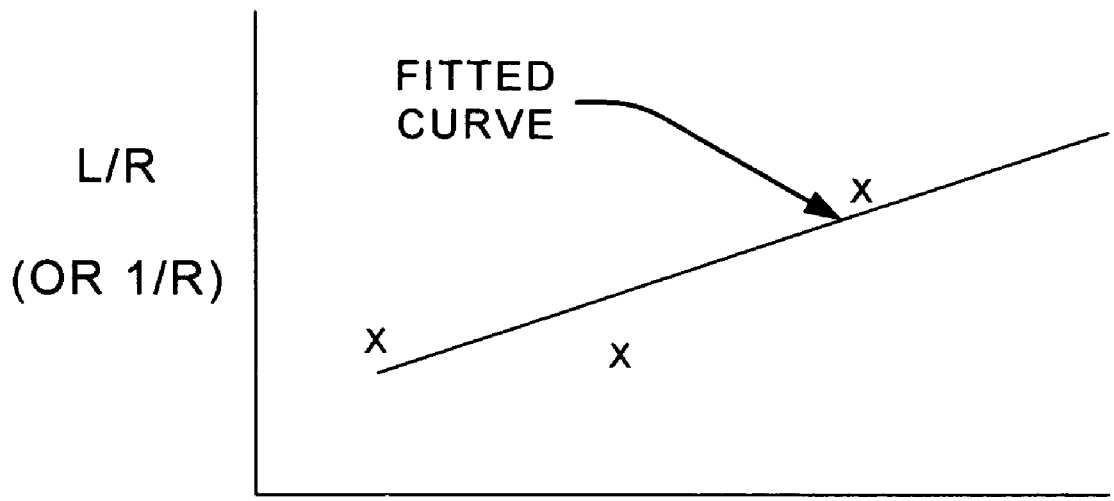
FIG. 3 shows an example of a fitted curve (straight line) calculated for: (1) (y-axis) the measured resistance (Ri) divided by the effective length (R1/L1, R2/L2, . . . Ri /Li) and (2) (x-axis) the effective widths (W1, W2, . . . Wi ) of the test structures according to an example embodiment.

As shown in FIG. 3, a fitted curve can be calculated for:

(1) (y-axis) by the effective length divided the measured resistance (e.g., dependent variable) (L1/R1, L2/R2, ... Li/Ri) and (2) (x-axis) the effective widths (W1, W2, ... Wi ) (independent variable) of the test structures. In this example, a least squares fitted straight line can be calculated.

For this example, where there is one independent variable (W) (we assume the L is not changed—e.g., L1=L2= ... Li), there is 1 degree of freedom (N). Therefore, we need at least 3 data points (N+2) to calculate a goodness of fit measurement.

Also, if all the test sites have the same effective length (L), the fitted curve can be calculated for:

(1) (y-axis) one divided by resistance (e.g., dependent variable) (1/R1, 1/R2, ... 1/Ri) and (2) (x-axis) the effective widths (W1, W2, ... Wi ) (independent variable) of the test structures. In this example, a least squares fitted straight line can be calculated.

Next, a goodness of fit measurement value (e.g., correlation coefficient (R) or standard error measurement ) is calculated for a fitted curve (e.g., least squares fitted straight line).

The processes used to form the device can be controlled or the devices screened using the goodness of fit measurement (of the L/R vs W ). For example, 95% percentile or 3 sigma limits can be placed on the value of the goodness of fit measurement. If the goodness of fit measurement is outside of the control limits established, the device (or wafer) is flagged or the process is flagged for process control or other corrective action.

Figure 4A:
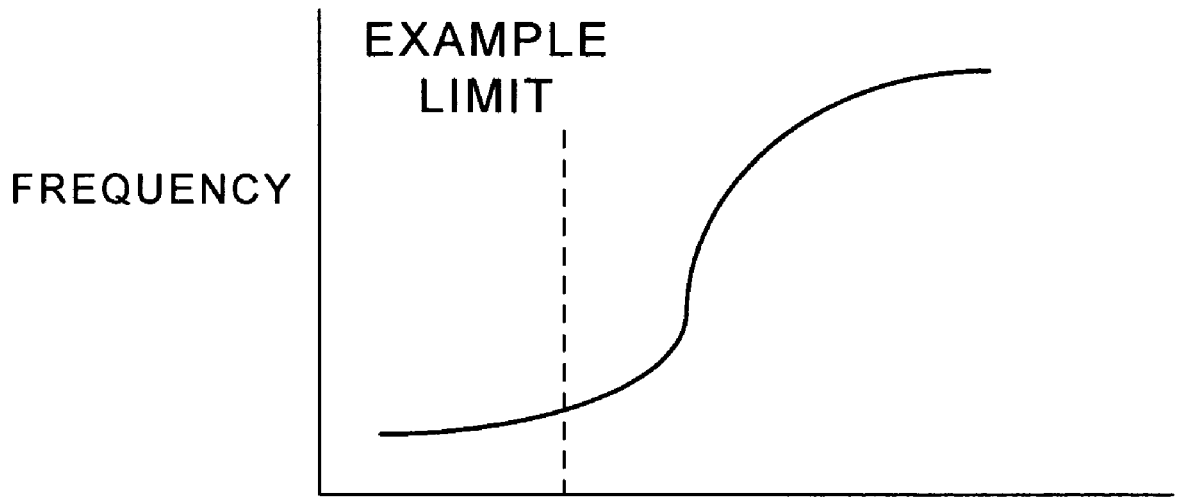
FIG. 4A shows an example frequency plot of r (correlation coefficient) vs frequency according to an example embodiment of the invention.

FIG. 4A shows an example frequency plot of r (correlation coefficient) vs frequency. A process control or warning limit can be established base on historical data of r (correlation coefficient) or product requirements.

Figure 4B:
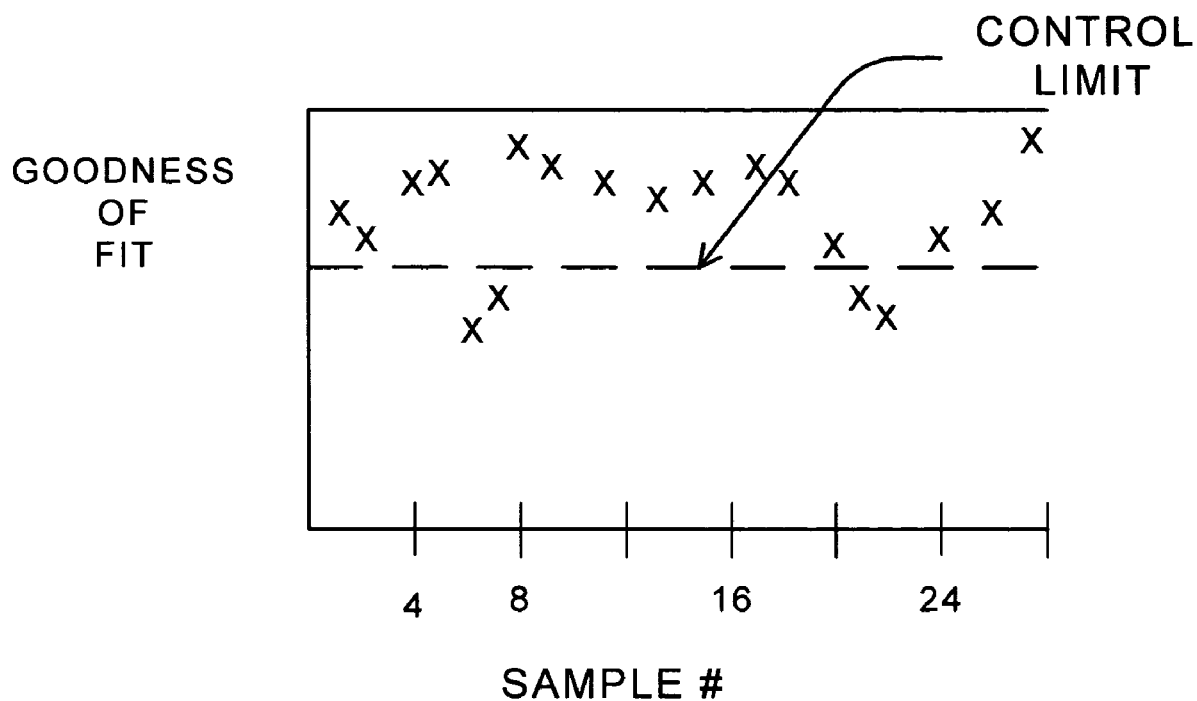
FIG. 4B shows an example "goodness of fit value" (e.g., correlation coefficient) vs sample showing an example control limit according to an example embodiment of the invention.

FIG. 4B shows an example "goodness of fit value" (e.g., correlation coefficient) vs sample # showing an example control limit. The samples 6, 7, 20 and 21 fell below the control limit and would be flagged.

The embodiments goodness of fit tests are more sensitive than standard SPC methods because the resistance variation shows up when tested across multiple width test structures (possibly, some type defects test better on different type/width test structures). Also, for the example where the test condition if varied (see FIG. 5), possibly some type defects show up at better at different test conditions(e.g., temperature). The use of multiple data points also minimizes the "noise" in the process/testing because the other variables that could affect the test are more constant.

Another advantage of this embodiments' use for process control is the early detection of 'latent' defects which do not kill a circuit immediately, but which are reliability hazards (such as a metal line with a notch or void or embedded particle becoming an open circuit during operation because of electromigration due to the higher current density.) Also, because the electrical resistance measurement may be performed after the completion of the device (wafer), it is also sensitive to defects, such as voids due to stress migration, that can develop after the formation of the test structures. Comparison of the goodness of fit values derived from measuring the resistances immediately after formation of the test structures, and after completion of all process steps may also be done to monitor and control defects that may form in later process steps.

A. Sample Size—Various Examples

To calculate a goodness of fit value for data with N degrees of freedom (e.g., N independent variables), we need N+2 data points. For example, for the resistance test above, we had 1 degrees of freedom--the Width of the resistance test structure (independent variable)—and therefore need 3 data points.

There are many different ways to set the sample size for the curve fitting and goodness of fit tests. Examples include sampling by wafer (minimum 3 measurements/wafer), by wafers or devices in a batch (process by a batch tool) (e.g., multiple wafer in a metal sputter tool), by wafers or device thru a tool in a given time period (or sequence) (for example a set of wafers thru a photo tool in a set time period or sequence of runs).

Sampling may also vary according to circumstances. For example, routine monitoring may consist of measuring 3 test structures on x number of wafers per batch. If one of more of the sample wafers indicate an excursion, then a further sampling or even all of the remaining wafers may be measured to confirm the excursion or the extent of the problem and also possibly to screen out defective wafers.

To calculate a goodness of fit value, at least 3 data points are need in this example of a linear regression (with 1 independent variable). The more data points to better the result in the sense of more samples for detection. However, the more data points uses up more using more area on the wafer (for test sites) and increased test time. In a first example, a wafer has at least 3 test structures where resistance is measured. The three test structure have different effective widths. More test structures can be measured and this can improve the accuracy of the goodness of fit test (e.g., correlation coefficient).

In another example, a wafer with a test structure is tested at three different conditions (e.g., 3 different temperatures ).

Figure 5A:
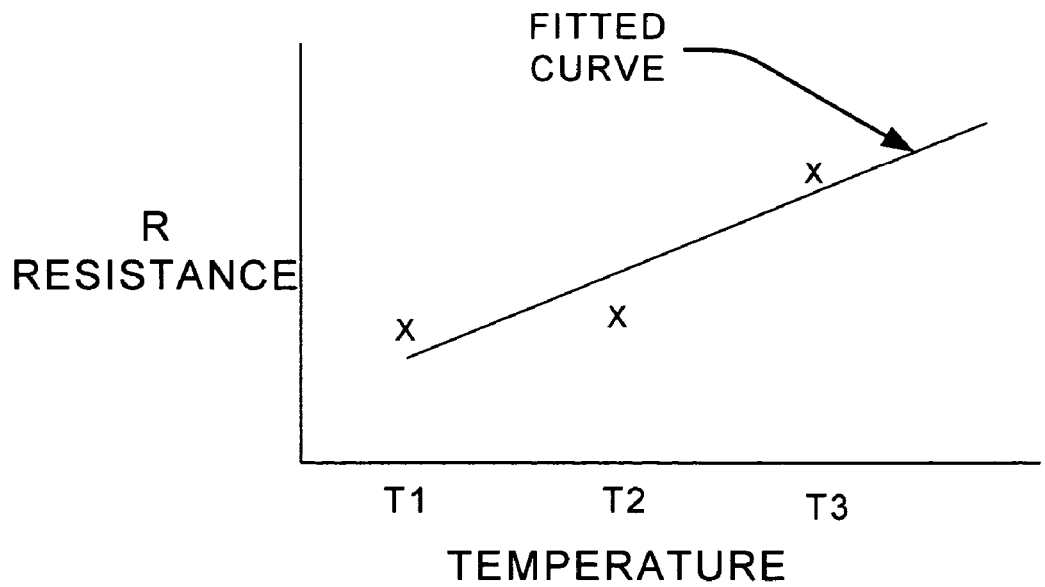
FIG. 5A shows an example of a fitted curve for R vs. Temperature according to an example embodiment.

In another possible example, multiple test sites (all the same layout) on the same wafer are tested under 2 or more conditions. For example, resistance can be measured three times on 3 different test sites (all same width) at 3 different temperatures. For example, FIG. 5A shows a plot of resistance vs Temperature.

In another example, a wafer(s) with 3 different test structures (e.g., resistance test structure with different effective widths W1, W2, W3) is tested at 2 different temperatures (T1 and T2). FIG. 5B shows an table with sample resistance values (R). A curve can be fitted to the data for each temperature and a goodness of fit values calculated for each curve. Different goodness of fit values for the two temperatures may be another indication of defects.

The above examples are non-limiting and combinations of the above examples can be used.

EXAMPLES

The following non-limiting examples represent preferred forms and best modes contemplated by the inventor for practice of his invention, as well as illustrating the results obtained through its use.

A. Resistance Test—

Below is an example of an embodiment of the invention simulated for a resistance measurement of test structure on a integrated circuit. The simulation is for 30 long lines, divided into 30 individual segments of 1 μm.

The electrical resistance of a line or wire is well known to be:

$$R = \rho(L/A) \quad (1)$$

where:
ρ is the resistivity
L is the resistor/conductor length
A is the cross-sectional area For a rectangular cross-section, $$A = W*T \quad (2)$$

with:
A=area
W being the resistor width
T being the height or thickness

In the case of a thin film, the resistance equation is often expressed as:

$$R = R_s(L/W) \quad (3)$$

with
R is resistance
$R_s$, known as sheet resistance, then defined as:

$$R_s = \rho/T \quad (4)$$

and the ratio of length to width, L/W, is often referred to as the number of squares, or square count.

In the semiconductor industry, a small difference in the width, W, from the designed value may be of significant importance. Hence, critical dimension (CD) measurements by optical techniques or by electron microscopy are routinely performed to control the manufacturing process. CD measurements may also be done electrically in the case of resistors and conductors by making use of the resistor equation as follows:

$$R = R_s\left(\frac{L + dL}{W + dW}\right) \quad (5)$$

with dL and dW being the dimensional differences due to variation that might arise from manufacturing from the designed, or intended, values of L and W. A positive value of dL or dW would indicate an increase whereas a negative value would indicate a loss from the designed dimensions.

Because typically dL<<L (or a test structure can be deliberately designed to be so since in modern semiconductor manufacturing dimensional variation is less than a tenth of a micron, and resistor lengths are at least a few microns), L+dL≅L, so equation (5) can be algebraically manipulated to:

$$\frac{L}{R} = \frac{W}{R_s} + \frac{dW}{R_s} \qquad (6)$$

Equation (6) is recognizable as a linear equation with the dependent variable (y axis) being 1/R, multiplied by the known value of L, the independent variable (x axis) being W, with slope $1/R_s$ and y-intercept of $dW/R_s$.

Thus, electrical monitors consisting of at least 2 resistors or conductors of variable widths, can be made to obtain sheet resistance and CD change. The resistances are measured, and a mathematical best fit by linear regression can be made to obtain the slope and y-intercept values, from which dW and $R_s$ can be calculated.

Mathematically, equation 6 requires the resistance measurement of at least 2 resistors or conductors to solve for the 2 unknown values of Rs and dW. Use of 3 or more resistors or conductors enables calculation of 'goodness of fit' values such as the correlation coefficient, and standard error of the regression. This embodiment recognizes and usefully employs the goodness of fit parameters to detect defects. This is because the random presence of defects materially changes the relationship shown in equation 6; i.e., randomly appearing defects introduce additional terms to equation 6 that depend on the number of defects, their sizes and shapes. That is, the presence of defects would cause more scatter in the data so the fitted line would have a lower correlation coefficient and higher standard error.

A simulation of a set of three, 30 um long, 0.5 um thick aluminum alloy resistors with equivalent sheet resistance of 60 milli-ohms/sq., and linewidths of 0.6, 0.5 and 0.4 um, was carried out using Microsoft Excel. A Monte Carlo type simulation was carried out to demonstrate that the correlation coefficient or the standard error (amongst possible other statistical measures) can be a useful parameter to detect the presence of defects. For the simulation, each resistor was divided into a continuous string of thirty 1 um long segments, with each individual segment having a 10% probability of containing a defect of dimensions 0.1 um wide and 0.1 um deep located at the center of an edge of the segment; that is a notch in the shape of a square into the metal.

A segment without a defect has a resistance according to equation 3. A segment with a defect has an increased resistance due to an increased square count that can be approximated by sub-dividing the segment into the two rectangular pieces outside the defect, and the rectangular area that is reduced by the defect. Then the squares corresponding to these 3 pieces are added together.

In this case of a square defect, there is an exact solution for the square count, (See e.g., R. W. Berry et. al., *Thin Film Technology*, Van Nostrand Reinhold Co., 1968, p 490.) which is:

$$\frac{n}{2} = \frac{L_1}{W_1} + \frac{L_2}{W_2} + \frac{1}{2\pi}\left[\frac{(S^2+1)}{S}\ln\left(\frac{S+1}{S-1}\right) - 2\ln\left(\frac{4S}{S^2-1}\right)\right] \qquad (7)$$

where
  n is the square count
  $L_1$ is half the length of the defect, or 0.05
  $W_1$ is the width of the resistor segment minus the defect dimension, or, in this example, W−0.1
  $L_2$ is the length of one of the sub-rectangles without the defect, or 0.45
  $W_2$ is the resistor width, or W
  $S=W_2/W_1$, or W/(W−0.1)

The results for individual 0.6 um, 0.5 um, and 0.4 um wide segments with a defect are 1.76145, 2.13576, and 2.71282 squares, respectively, and are slightly larger than the corresponding values that would be obtained by the approximation method described above. The square counts resulting from this more exact equation is referred to as "No. Squares" in the simulation results. The results are for 30 um long lines, divided into 30 individual segments of 1 μm.

B. Simulation Results—Table A

Table A below shows the results of the simulation.

TABLE A

| Simulation Sequence | No. Defects | No. Squares | Width | Slope | Intercept | $R_s$ | dW | $R^2$ $1-R^2$ | Std Error |
|---|---|---|---|---|---|---|---|---|---|
| 1 | 1 | 9.981079 | 0.6 | 16.76017 | −0.0718687 | 0.059665 | −0.0042881 | 0.999989384 | 7.7229E−03 |
|   | 1 | 8.314521 | 0.5 |          |            |          |            | 1.06163E−05 |            |
|   | 2 | 6.629045 | 0.4 |          |            |          |            |            |            |
| 2 | 2 | 9.962229 | 0.6 | 16.75918 | −0.0963319 | 0.059669 | −0.005748  | 0.999990038 | 7.4808E−03 |
|   | 3 | 8.277149 | 0.5 |          |            |          |            | 9.96221E−06 |            |
|   | 3 | 6.610394 | 0.4 |          |            |          |            |            |            |
| 3 | 3 | 9.943451 | 0.6 | 16.57203 | −0.0027982 | 0.060343 | −0.00017   | 0.999989952 | 7.4291E−03 |
|   | 3 | 8.277149 | 0.5 |          |            |          |            | 1.00481E−05 |            |
|   | 2 | 6.629045 | 0.4 |          |            |          |            |            |            |
| 4 | 3 | 9.943451 | 0.6 | 16.85024 | −0.1604517 | 0.059346 | −0.0095222 | 0.999958849 | 1.5287E−02 |
|   | 3 | 8.277149 | 0.5 |          |            |          |            | 4.11505E−05 |            |
|   | 5 | 6.573403 | 0.4 |          |            |          |            |            |            |
| 5 | 4 | 9.924743 | 0.6 | 16.66448 | −0.0800073 | 0.060008 | −0.0048011 | 0.99996032  | 1.4846E−02 |
|   | 5 | 8.240112 | 0.5 |          |            |          |            | 3.968E−05   |            |
|   | 4 | 6.591846 | 0.4 |          |            |          |            |            |            |
| 6 | 3 | 9.943451 | 0.6 | 16.75802 | −0.0957383 | 0.059673 | −0.005713  | 0.999739295 | 3.8271E−02 |
|   | 1 | 8.314521 | 0.5 |          |            |          |            | 2.60705E−04 |            |
|   | 4 | 6.591846 | 0.4 |          |            |          |            |            |            |

TABLE A-continued

Results

| Simulation Sequence | No. Defects | No. Squares | Width | Slope | Intercept | $R_s$ | dW | $R^2$ / $1-R^2$ | Std Error |
|---|---|---|---|---|---|---|---|---|---|
| 7 | 1 | 9.981079 | 0.6 | 16.85343 | −0.1309582 | 0.059335 | −0.0077704 | 1 | 4.6332E−05 |
|   | 2 | 8.295793 | 0.5 |  |  |  |  | 3.77882E−10 |  |
|   | 3 | 6.610394 | 0.4 |  |  |  |  |  |  |
| 8 | 4 | 9.924743 | 0.6 | 16.47849 | 0.04395002 | 0.060685 | 0.00266711 | 0.999956158 | 1.5431E−02 |
|   | 2 | 8.295793 | 0.5 |  |  |  |  | 4.38424E−05 |  |
|   | 2 | 6.629045 | 0.4 |  |  |  |  |  |  |
| 9 | 1 | 9.981079 | 0.6 | 16.85343 | −0.1371727 | 0.059335 | −0.0081392 | 0.999959459 | 1.5176E−02 |
|   | 3 | 8.277149 | 0.5 |  |  |  |  | 4.05412E−05 |  |
|   | 3 | 6.610394 | 0.4 |  |  |  |  |  |  |
| 10 | 0 | 10 | 0.6 | 17.04077 | −0.2674271 | 0.058683 | −0.0156934 | 0.998096413 | 1.0525E−01 |
|   | 9 | 8.167024 | 0.5 |  |  |  |  | 1.903587E−03 |  |
|   | 4 | 6.591846 | 0.4 |  |  |  |  |  |  |
| 11 | 2 | 9.962229 | 0.6 | 16.47781 | 0.06310843 | 0.060688 | 0.00382990 | 0.999829238 | 3.0454E−02 |
|   | 3 | 8.277149 | 0.5 |  |  |  |  | 1.70762E−04 |  |
|   | 0 | 6.666667 | 0.4 |  |  |  |  |  |  |
| 12 | 6 | 9.887538 | 0.6 | 16.29246 | 0.12456159 | 0.061378 | 0.00764535 | 0.999823426 | 3.0620E−02 |
|   | 2 | 8.295793 | 0.5 |  |  |  |  | 1.76574E−04 |  |
|   | 2 | 6.629045 | 0.4 |  |  |  |  |  |  |
| 13 | 1 | 9.981079 | 0.6 | 16.94616 | −0.2020687 | 0.05901 | −0.0119242 | 0.999750695 | 3.7845E−02 |
|   | 5 | 8.240112 | 0.5 |  |  |  |  | 2.49305E−04 |  |
|   | 4 | 6.591846 | 0.4 |  |  |  |  |  |  |
| 14 | 6 | 9.887538 | 0.6 | 16.29246 | 0.10600141 | 0.061378 | 0.00650616 | 0.999958502 | 1.4843E−02 |
|   | 5 | 8.240112 | 0.5 |  |  |  |  | 4.14983E−05 |  |
|   | 2 | 6.629045 | 0.4 |  |  |  |  |  |  |
| 15 | 2 | 9.962229 | 0.6 | 16.85191 | −0.1550689 | 0.05934 | −0.0092019 | 0.999960053 | 1.5063E−02 |
|   | 4 | 8.258589 | 0.5 |  |  |  |  | 3.9947E−05 |  |
|   | 4 | 6.591846 | 0.4 |  |  |  |  |  |  |

The simulation was of 30 um long lines, divided into 30 individual segments of 1 μm.

The results of 15 random trials are shown in table A above, where "No. Defects" is the total number of defects derived from the 10% probability of each of the 30 segments having a defect, "$R^2$" is the correlation coefficient for a linear regression calculated with the Excel function RSQ, and "Std Error" is the standard error of the regression, calculated with the Excel function STEYX.

The simulation results show that more defects result in a poorer fit as seen by lower values in the correlation coefficient (or its deviation from unity, $1-R^2$,) and higher values of the standard error For comparison, for zero defects in all 3 of the example linewidths, Excel calculates a correlation coefficient of 1.0 (or $1-R^2$ of about 1E−15) and standard error of less than 1E−6.

Thus, it is concluded that the presence of defects significantly degrades the "goodness of fit statistics". In actual practice, it may be necessary to first establish the baseline statistics for a given production line. Then ongoing routine electrical measurements and calculations of the type described in this disclosure can be used to monitor for significant deviations from the normal baseline, thereby giving a signal to scrap or further evaluate potential unreliable or poor quality films or lines or resistors. The calculations are readily done by the existing modern measurement tools already being used which are controlled by computers with capabilities for performing the regression and goodness of fit statistics.

It is also apparent that the sensitivity of the line resistance to defects increase as the linewidth becomes smaller. Thus, this technique is also scalable, and becomes more valuable as the technology shrinks.

This example shows that common "goodness of fit" statistics such as the correlation coefficient and standard error can be usefully employed to monitor the stability of a process. It is also likely that other statistical values or parameters, such as F statistics may also be used in the same manner, but the correlation coefficient and standard error were used as a simple demonstration.

OTHER EXAMPLES

E.g. Capacitance

Most generally embodiments of this invention can be applied to any measurable parameter (dependent variable) that can be related by a mathematical equation to one or more independent variables.

Another example is the monitoring of dielectric capacitance such as for gate oxides. Two components may contribute to the measured capacitance, the area or parallel plate capacitance and the perimeter or fringe capacitance if the measured capacitor is made sufficiently distant from another capacitor so that coupling capacitance is not significant. The capacitance can then be represented by:

$$C_{meas.} = C_{area} + C_{fringe}$$

Where $C_{meas.}$ is total capacitance measured $C_{area}$ is Capacitance of area component $C_{fringe}$ capacitance of fringe component Further, the fringe capacitance can be represented by a unit length capacitance multiplied by the perimeter (P):

$$C_{meas.} = C_{area} + P * c_{fringe}$$

where P is the perimeter length and $c_{fringe}$ is the capacitance per length.

Note: Above, we deliberately used lower case c to distinguish this from upper case $C_{fringe}$ above.

By using 3 or more capacitors of the same area, but different perimeter lengths (for example any 3 or more capacitors of area 100 sq. um, consisting of length and width of 1×100, 2×50, 4×25, 5×20, or 10×10 um), the measured capacitance can be curve fitted to the perimeter. Then again, goodness of fit values can be used to evaluate whether there is an issue or problem with the capacitors.

Benefits

Embodiments of the invention are automated, scalable testing technique for detecting very small defects or low level fluctuations. The technique can also be applied immediately after the conductor or resistor is fabricated, or after completion of all process steps so that defects such as stress induced metal voids that are generated in later processing, can also be detected. The technique, however, is not restricted to metal lines, but can be applied to doped Si , doped polysilicon, polycides, and salicides; that is, to any film whose resistance can be measured.

The invention can be implemented using any type of test and test structure. For example, tests could include capacitance test. Test structures can be used that have structures formed adjacent to said resistive portion to measure the effects of micro loading or chemical-mechanical polishing. See U.S. Pat. No. 6,403,389 (Chang, et al.). Also, for example the test structures described in U.S. Pat. No. 6,403,389 (Chang, et al.) could be used.

In the above description numerous specific details are set forth such as widths, lengths, thicknesses, etc., in order to provide a more thorough understanding of the present invention. It will be obvious, however, to one skilled in the art that the present invention may be practiced without these details. In other instances, well known processes have not been described in detail in order to not unnecessarily obscure the present invention.

Unless explicitly stated otherwise, each numerical value and range should be interpreted as being approximate as if the word about or approximately preceded the value of the value or range.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A test method comprising:
providing first, second and third test structures on a wafer with first, second and third test structure parameters comprising resistive portions from which test measurement values of resistances are measured, wherein the resistive portions comprise effective lengths and effective widths;
obtaining test measurement values from the test structures;
calculating a goodness of fit value for a fitted curve between the effective lengths divided by the test measurement values and the effective widths of the resistive portions; and
using said goodness of fit value to monitor processes used to form a device.

2. The method of claim 1 further comprises using control limits on the goodness of fit value and using said goodness of fit value to control the processes used to form the device or to screen the device.

3. The method of claim 1 further comprises:
using control limits on the goodness of fit value, wherein the control limits are established based on a history of goodness of fit values or on device requirements; and
using said goodness of fit value to control the processes used to form the device or to screen the device.

4. The method of claim 1 wherein the goodness of fit value is a correlation coefficient or a standard error measurement.

5. The method of claim 1 wherein the fitted curve is a least squares fitted straight line.

6. The method of claim 1 further comprises using the goodness of fit value to control the processes used to form the device or to screen the device.

7. The method of claim 1 wherein the test measurement values are obtained on two or more test sites on the device.

8. The method of claim 1 wherein the first, second and third test structure parameter comprises an area of a capacitive portion of the respective first, second and third test structure.

9. A test method comprising:
a) providing a device structure that has at least a first test structure, a second test structure and a third test structure incorporating resistive portions from which resistance is measured;
   (1) said resistive portions having an effective length (Lx) and an effective width (Wx),
   (2) said first, second and third test structures have resistive portions with different effective widths (W1 W2, . . . Wi);
   (3) said resistive portions of said first, second and third test structures have effective lengths (L1, L2, . . . Li);
b) measuring the resistance (R) of the test structures;
c) calculating a goodness of fit value for a fitted curve between:
   (1) said effective lengths divided by the measured resistances (L1/R1, L2/R2, . . . Li/Ri); and
   (2) the effective widths (W1, W2, . . . Wi) of the resistive portions of the test structures;
d) using said goodness of fit value to: (1) control processes used to form the device structure or (2) screen the device structure.

10. The method of claim 9 wherein said fitted curve is a fitted straight line fitted using a least squares method.

11. The method of claim 9 wherein said test structures are formed in and/or over a wafer.

12. The method of claim 9 wherein said test structures are comprised of a doped region in a wafer.

13. The method of claim 9 wherein said test structures are comprised of a conductive material and an interconnect layer in a semiconductor device is comprised of said conductive material.

14. The method of claim 9 wherein said test structures are comprised of metal from a metal layer that is used to form metal lines in a semiconductor devices.

15. The method of claim 9 wherein said test structures are comprised of a material selected from the group consisting of silicon, amorphous silicon, polysilicon, polycide, silicide, metal, copper, aluminum, and alloys and combinations thereof.

16. The method of claim 9 wherein said goodness of fit value is a correlation coefficient, coefficient of determination or standard error measurement test.

17. The method of claim 9 wherein said resistive portions have said effective lengths being substantially greater than said effective widths, and said effective widths being selected to be substantially greater than an expected critical dimension loss for said processes.

18. The method of claim 9 wherein the measuring the resistance (R) of the test structures comprises measuring the resistance at different temperatures; and further includes: calculating the goodness of fit value for a straight line for the between:
   (1) the effective lengths divided by the measured resistances (L1/R1, L2/R2, . . . Li/Ri); the effective lengths of the test structures are equal(L1=L2= . . . Li); and
   (2) the effective widths (W1, W2, . . . Wi) of the test structures; and
   (3) the temperature.

19. The method of claim 9 wherein said device structure is a wafer; said wafer has at least three test structures;
   the goodness of fit value is calculated on measurements made on the test sites on said wafer.

20. The method of claim 9 wherein said device structure is a printed circuit board, a ceramic substrate or a chip scale package.

21. The method of claim 9 wherein structures are formed adjacent to said resistive portion to measure effects of micro loading or chemical-mechanical polishing.

22. A method for estimating defect levels by measurements related to resistance of an interconnect layer in a process for manufacturing an integrated circuit, said method comprising the steps of:
   a) fabricating on a wafer, using processes, at least a first test structure, a second test structure and a third test structure incorporating a resistive portion from which a resistance is measured;
   b) said resistive portion having an effective length and an effective width, said effective length being substantially greater than said effective width, and said effective width being selected to be substantially greater than an expected critical dimension loss for said processes;
   c) measuring said resistance of the test structures; and
   d) deriving the sheet resistances from the resistance measurements;
   e) calculating a goodness of fit value between the one divided by the sheet resistances (1/Rs) and a second parameter;
   f) using said goodness of fit value to: (1) control the processes used to form the test structures or (2) screen the test structures.

23. The method of claim 22 where said second parameter is the effective width of the test structures or the temperature.

24. A test method comprising:
   providing a device structure that has at least first, second and third test structures, the test structures comprise resistive portions having effective lengths and widths from which a test parameter of resistance is measured;
   measuring test parameter values on the test structures;
   calculating a goodness of fit value for a fitted curve between the effective lengths divided by the test parameter values and the effective widths of the resistive portion;
   d) using said goodness of fit value to control processes used to form the device structure or to screen the device structure.

25. A test method comprising:
   providing a device structure on a wafer that has a plurality of test structures with respective test structure parameters;
   measuring a first test measurement, a second test measurement and a third test measurement on at least a first test structure, wherein the first test structure is a resistance test structure that has a effective length (L) and effective Width (W), the first test measurement is a resistance test measurement;
   calculating a goodness of fit value for a fitted curve between at least,
      the first test measurement performed under a first test condition,
      the second test measurement performed under a second test condition, and
      the third test measurement performed under a third test condition,
      wherein the test conditions have different temperatures,
      wherein the goodness of fit value is for a straight line fitted to the effective length (L) divided by the resistance (R) vs. the effective width (W); and
   using the goodness of fit value to control processes used to form the device structure or to screen the device structure.

26. The method of claim 25 wherein: said first test condition, said second test condition and said third test condition are different temperatures.

27. A method of forming a device comprising:
   providing test structures on a wafer, the test structures having respective test structure parameters comprising resistive portions from which test measurement values of resistances are measured, wherein the resistive portions comprise effective lengths and effective widths;
   obtaining test measurement values which are based on the test structure parameters;
   determining a goodness of fit value based on the effective lengths divided by the test parameter values and the effective widths of the resistive portions; and
   screening wafers on which devices are formed based on a scrap limit established from the goodness of fit value.

28. The method of claim 27 wherein test measurements are performed under test conditions.

29. The method of claim 27 wherein test measurements are performed under respective test conditions.

30. The method of claim 27 wherein the test conditions comprise different temperatures.

31. The method of claim 30 wherein the goodness of fit value is for a straight line fitted to the effective length divided by the resistance verses the effective width.

32. The method of claim 27 wherein the goodness of fit value is for a straight line fitted to the effective length divided by the resistance verses the effective width.

* * * * *